US006300037B1

(12) United States Patent
Fujii et al.

(10) Patent No.: US 6,300,037 B1
(45) Date of Patent: Oct. 9, 2001

(54) PHOTOSENSITIVE RESIN COMPOSITION AND ADHESIVE

(75) Inventors: Hirofumi Fujii; Satoshi Tanigawa, both of Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 09/437,232

(22) Filed: Nov. 10, 1999

(30) Foreign Application Priority Data

Nov. 30, 1998 (JP) .................................................. 10-339201

(51) Int. Cl.[7] .............................. G03F 7/004; B32B 31/00
(52) U.S. Cl. .................... 430/270.1; 430/330; 156/272.2
(58) Field of Search ................................ 430/270.1, 330; 156/272.2, 275.5; 525/928; 528/335, 430, 156

(56) References Cited

U.S. PATENT DOCUMENTS

| | | | |
|---|---|---|---|
| 5,230,990 | * 7/1993 | Iwasaki et al. | 430/321 |
| 6,017,681 | * 1/2000 | Tsukamoto et al. | 430/321 |

* cited by examiner

*Primary Examiner*—Rosemary E. Ashton
(74) *Attorney, Agent, or Firm*—Sughrue, Mion, Zinn, Macpeak & Seas, PLLC

(57) ABSTRACT

An adhesive in the form of a patterned film is disclosed, which is obtained from a photositive resin composition and exhibits satisfactory adhesive properties even when used for electronic parts of various shapes having a rugged surface. The adhesive is obtained from a photosensitive polyimide resin precursor which, after pattern formation, melts upon heating. The adhesive has a melt viscosity at 250 ° C. from 1,000 to 1,000,000 Pa·s.

14 Claims, No Drawings

PHOTOSENSITIVE RESIN COMPOSITION AND ADHESIVE

FIELD OF THE INVENTION

The present invention relates to a photosensitive resin composition which can be formed into a patterned film by exposing the composition to light through a photomask and then developing the exposed composition, and to an adhesive in the form of a patterned film formed from the composition.

BACKGROUND OF THE INVENTION

It has been proposed to use a patterned adhesive in various electronic parts, for example, for bonding a semiconductor element to a lead frame, bonding a semiconductor element to a circuit board, or bonding circuit boards to each other. Such an adhesive is generally obtained by applying a photosensitive resin composition to a semiconductor element, lead frame, circuit board, or the like as one adherend to first form a coating film of the composition, exposing the coating film to light through a photomask, and then developing the coating film to impart a given pattern thereto. Thereafter, the other adherend is superposed on the patterned adhesive to bond the adherends to each other by hot pressing.

In general, conventional adhesives such as the above one soften in hot pressing and penetrate into rugged surfaces of adherends to produce an anchoring effect. Thus, an adhesive strength is obtained.

However, such an adhesive does not have sufficient flowability in hot pressing although it softens, because it has a crosslinked structure formed during pattern formation through exposure and development. This adhesive hence penetrates insufficiently into the rugged surface of an adherend. As a result, vacant spaces remain on part of the bonding surface and a sufficient adhesive strength cannot be obtained.

Incidentally, recent electronic parts contain electronic elements in which the wirings, terminals, and other components have various shapes. The bonding surfaces of these components are not merely flat but rugged, and such rugged bonding surfaces tend to become more complicated and finer.

Consequently, use of adhesives such as the above-described one in bonding electronic elements results in bonding failures.

SUMMARY OF THE INVENTION

An object of the present invention is to provide a photosensitive resin composition capable of forming a patterned film by being exposed to light through a photomask and then developed, wherein the patterned film melts upon heating. Another object of the present invention is to provide an adhesive in the form of a pattern film which is obtained from the photosensitive resin composition and exhibits satisfactory adhesive properties even when used for electronic parts of various shapes having a rugged surface.

The term "rugged surface" used above includes surfaces having a roughness on the order of millimeter or micrometer or a finer roughness. Namely, it includes adherends which apparently have a flat surface.

The present invention provides a photosensitive resin composition capable of forming a patterned film by being exposed to light through a photomask and then developed, said patterned film melting upon heating. Especially preferred as the photosensitive resin composition is a photosensitive polyimide resin precursor.

The present invention further provides an adhesive in the form of a patterned film which is obtained by forming a coating film of the photosensitive resin composition on a surface of an adherend, exposing the coating film to light through a photomask, and then developing the coating film. This adhesive is characterized by melting upon heating and preferably having a melt viscosity at 250° C. of from 1,000 to 1,000,000 Pa·s.

DETAILED DESCRIPTION OF THE INVENTION

Examples of the photosensitive resin composition of the present invention include a photosensitive polyimide resin precursor, a photosensitive polyethersulfone, and the like. Especially preferred is a photosensitive polyimide resin precursor.

The photosensitive polyimide resin precursor can be obtained by reacting an acid dianhydride ingredient with a diamine ingredient in a substantially equimolar proportion in an appropriate organic solvent, e.g., N,N-dimethylacetamide or N-methyl-2-pyrrolidone, to yield a polyamic acid (for example, the polymerization is effected at room temperature and under dry and nitrogen atmosphere to provide a concentration of polyamic acid of 15 to 30% by weight) and mixing this polymer with a photosensitizer. An epoxy resin, nadic imide, maleimide, or the like may be added thereto if desired.

Examples of the acid dianhydride ingredient include 3,3',4,4'-biphenyltetracarboxylic dianhydride, 2,2 ', 3,3'-biphenyltetracarboxylic dianhydride, 3,3',4,4'-benzophenonetetracarboxylic dianhydride, 2,2',3,3'-benzophenonetetracarboxylic dianhydride, 4,4'-hydroxydiphthalic dianhydride, 2,2-bis(2,3-dicarboxyphenyl)hexafluoropropane dianhydride, 2,2-bis(3,4-dicarboxyphenyl)hexafluoropropane dianhydride (6FDA), bis(2,3-dicarboxyphenyl)methane dianhydride, bis(3,4-dicarboxyphenyl)methane dianhydride, bis(2,3-dicarboxyphenyl) sulfone dianhydride, bis(3,4-dicarboxyphenyl) sulfone dianhydride, pyromellitic dianhydride, and ethylene glycol bistrimellitate dianhydride. These dianhydrides may be used alone or in combination of two or more thereof.

Especially preferred for use in the present invention is 6FDA, represented by the following general formula (2), ethylene glycol bistrimellitate dianhydride, represented by the following general formula (5), 4,4'-hydroxydiphthalic dianhydride, or 3,3',4,4'-benzophenonetetracarboxylic dianhydride.

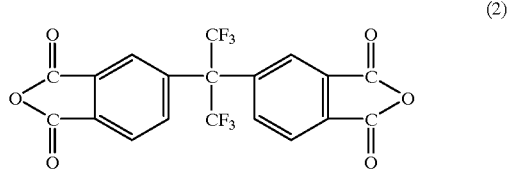

(2)

(5)

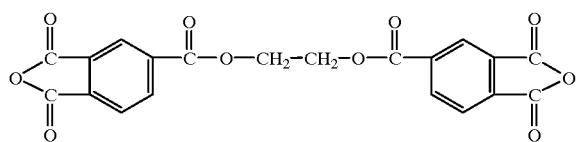

Examples of the diamine ingredient include diamines such as 4,4'-diaminodiphenyl ether, 3,4'-diaminodiphenyl ether, 3,3'-diaminodiphenyl ether, m-phenylenediamine, p-phenylenediamine, 4,4'-diaminodiphenylpropane, 3,3'-diaminodiphenylpropane, 4,4'-diaminodiphenylmethane, 3,3'-diaminodiphenylmethane, 4,4'-diaminodiphenyl sulfide, 3,3'-diaminodiphenyl sulfide, 4,4'-diaminodiphenyl sulfone, 3,3'-diaminodiphenyl sulfone, 1,4-bis(4-aminophenoxy)benzene, 1,3-bis(4-aminophenoxy)benzene, 1,3-bis(3-aminophenoxy)benzene, 1,3-bis(4-aminophenoxy)-2,2-dimethylpropane, hexamethylenediamine, 1,8-diaminooctane, 1,12-diaminododecane, and 4,4'-diaminobenzophenone. These diamines may be used alone or in combination of two or more thereof.

Preferred for use in the present invention is 4,4'-diaminodiphenyl ether, 1,3-bis(4-aminophenoxy)benzene, 1,3-bis (3-aminophenoxy)benzene, represented by the following general formula (4), or a diamine represented by the following general formula (3). Especially preferred is the diamine represented by general formula (3) wherein n=1 (bisaminopropyltetramethyldisiloxane).

(4)

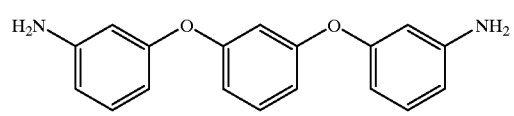

(3)

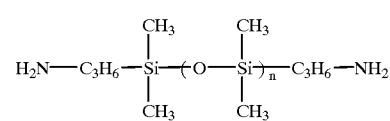

(n is an integer of 1 to 10.)

The photosensitizer is preferably a 1,4-dihydropyridine derivative represented by the following general formula (1):

(1)

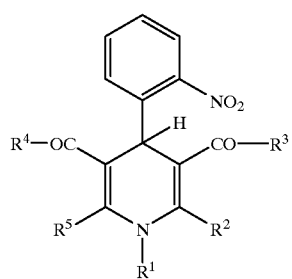

wherein $R^1$ to $R^5$ each independently is a hydrogen atom or an organic group having 1 to 4 carbon atoms (e.g., methyl, ethyl, n-propyl, iso-propyl, n-butyl, iso-butyl, and tert-butyl).

Examples of the above photosensitizer include 1-ethyl-3,5-dimethoxycarbonyl-4-(2-nitrophenyl)-1,4-dihydropyridine, 1,2,6-trimethyl-3,5-dimethoxycarbonyl-4-(2-nitrophenyl)-1,4-dihydropyridine, 2,6-dimethyl-3,5-diacetyl -4-(2-nitrophenyl)-1,4-dihydropyridine, and 1-carboxyethyl -3,5-dimethoxycarbonyl-4-(2-nitrophenyl)-1,4-dihydropyridine. These may be used alone or in combination of two or more thereof. Especially preferred of these is 1-ethyl-3,5-dimethoxycarbonyl-4-(2-nitrophenyl)-1,4-dihydropyridine or 1,2,6-trimethyl-3,5-dimethoxycarbonyl-4-(2-nitrophenyl)-1,4-dihydropyridine.

The photosensitizer is used generally in an amount of from 0.1 to 1.0 mol per mol of the sum of the acid dianhydride ingredient and the diamine ingredient. If the amount thereof exceeds 1.0 mol, the excess photosensitizer remaining in hot pressing decomposes and volatilizes, leading to a decrease in adhesive strength. If the amount thereof is smaller than 0.1 mol, the ability to form a pattern is impaired.

The adhesive of the present invention is produced from the above-described photosensitive resin composition and used, for example, in the following manners.

The photosensitive resin composition described above is dissolved in an organic solvent. This solution is applied to an appropriate adherend and then dried to form a coating film. This coating film is exposed to light through a photomask and then developed, for example, by means of dipping method, spraying method or paddle method. If desired, the coating film can be subsequently heated to improve patterning properties. Thus, an adhesive of a desired pattern can be obtained.

For the exposure, actinic rays can be used, such as, e.g., ultraviolet, electron beams, or microwave.

Examples of the organic solvent include N-methyl-2-pyrrolidone, N,N-dimethylacetamide, and N,N-dimethylformamide.

Thereafter, another adherend is superposed on the patterned adhesive, and the resultant assemblage is hot-pressed at generally from 100 to 350° C., preferably from 150 to 250° C. Thus, the adherends can be bonded to each other.

From the standpoint of preventing the adherends from being damaged, the temperature for the hot pressing is preferably as low as possible within the above range.

The adhesive of the present invention, which is a patterned adhesive formed on an adherend surface by applying the photosensitive resin composition on the surface to form a coating film, subsequentlyexposingthefilm tolightthroughaphotomask, and then developing the film, is characterized by melting upon heating. This adhesive has been regulated so as to have a melt viscosity at 250° C. of preferably from 1,000 to 1,000,000 Pa·s, more preferably from 5,000 to 500,000 Pa·s.

Consequently, the adhesive melts during the hot pressing and conforms to the rugged surface of the adherend, i.e., penetrates into the rugged surface. As a result, satisfactory adhesive properties are exhibited.

If the melt viscosity of the adhesive is higher than 1,000,000 Pa·s, the adhesive cannot conform to the rugged surface of an adherend. If the melt viscosity thereof is lower than 1,000 Pa·s, the adhesive flows out during hot pressing to destroy the pattern, although adhesive properties are satisfactory.

In the present invention, the melt viscosity at 250° C. after pattern formation means the melt viscosity, as measured by the following method, of the adhesive obtained by exposing a film of the photosensitive resin composition to light through a photomask and subjecting the film to development and, if necessary, to heating, namely, the melt viscosity of the adhesive just before hot pressing.

The above melt viscosity in the present invention was measured in the following manner.

First, a solution prepared by dissolving the photosensitive resin composition in an organic solvent was applied on a copper foil and then dried to form a coating film. This film was exposed to light and, if desired, further heated. Thus, an adhesive layer was formed on the copper foil.

Subsequently, the copper foil was completely removed by alkali etching to obtain an adhesive film, which was used as a sample to be examined for melt viscosity.

The melt viscosity of this sample was measured with a dynamic viscoelastic tester (ARES, manufactured by Rheometoric Scientific) . (Measurement conditions: temperature, 250° C.; frequency, 0.5 Hz; parallel plate diameter, 25 mm; γ (rotational distortion), 0.01)

The adhesive of the present invention has a glass transition point ($T_g$) of preferably from 50 to 250° C., more preferably from 50 to 150° C.

The reasons for this are as follows. If the $T_g$ of the adhesive exceeds 250° C., a hot-pressing temperature exceeding 350° C. is generally necessary and this may damage the adherends. If the $T_g$ thereof is lower than 50° C., not only the pattern of the adhesive is not maintained during hot pressing, but the adhesive shows poor heat resistance after bonding.

In the present invention, the $T_g$ after pattern formation means the $T_g$, as measured by the following method, of the adhesive obtained by exposing a film of the photosensitive resin composition to light through a photomask and subjecting the film to development and, if necessary, to heating, namely, the $T_g$ of the adhesive just before hot pressing.

The above $T_g$ in the present invention was measured using the sample for melt viscosity measurement (adhesive film) as a sample with a TMA (TM7000, manufactured by ULVAC). (Measurement conditions: mode, tensile; sample width, 5 mm; sample thickness, any thickness between 15 and 30 μm; chuck-to-chuck distance, 15 mm; load, 2.5 g; heating rate, 10° C./min)

The thickness of the adhesive of the present invention is generally from 10to 50 μm. In the case where an adherend having projections on its surface is to be bonded, the thickness of the adhesive is preferably not smaller than the height of the projections.

In the case where the adhesive of the present invention is produced from the photosensitive polyimide resin precursor described above, the adhesive is produced and used, for example, in the following manners.

The photosensitive polyimide resin precursor is dissolved in an organic solvent. This solution is applied to an appropriate adherend and then dried to form a coating film. This coating film is exposed to light through a photomask and then developed to thereby obtain a positive or negative image, i.e., a desired pattern. This patterned film is finally heated to a high temperature to imidize the polyimide resin precursor. Thus, a patterned film (adhesive) consisting of a polyimide resin can be obtained. Examples of the organic solvent include N-methyl-2-pyrrolidone, N,N-dimethylacetamide, and N, N-dimethylformamide.

Thereafter, another adherend is superposed on the patterned adhesive consisting of a polyimide resin, and the resultant assemblage is hot-pressed at generally from 100 to 350° C., preferably from 100 to 250° C. Thus, the adherends can be bonded to each other.

From the standpoint of preventing the adherends from being damaged, the temperature for the hot pressing is preferably as low as possible within the above range.

The patterned adhesive of the present invention formed from the photosensitive polyimide resin precursor is characterized by melting upon heating. This adhesive has been regulated so as to have a melt viscosity at 250° C. of preferably from, 1,000 to 1,000,000 Pa·s, more preferably from 5,000 to 500,000 Pa·s.

The present invention will be explained below in more detail by reference to the following Examples and Comparative Examples, but the invention should not be construed as being limited to these Examples.

EXAMPLES 1 TO 9 AND COMPARATIVE EXAMPLES 1 AND 2

The following acid dianhydrides A to E, diamines A to D, and photosensitizers A and B were prepared first.

Acid dianhydride A: 6FDA
Acid dianhydride B: ethylene glycol bistrimellitate dianhydride
Acid dianhydride C: 4,4'-hydroxydiphthalic dianhydride
Acid dianhydride D: 3,3',4,4'-benzophenonetetracarboxylic dianhydride
Acid dianhydride E: pyromellitic dianhydride
Diamine A: 4,4'-diaminodiphenyl ether
Diamine B: bisaminopropyltetramethyldisiloxane
Diamine C: 1,3-bis(4-aminophenoxy)benzene
Diamine D: 1,3-bis(3-aminophenoxy)benzene
Photosensitizer A: 1-ethyl-3,5-dimethoxycarbonyl-4-(2-nitrophenyl)-1,4-dihydropyridine
Photosensitizer B: 1,2,6-trimethyl-3,5-dimethoxycarbonyl-4-(2-nitrophenyl)-1,4-dihydropyridine According to each of the formulations shown in Tables 1 to 3, an acid dianhydride ingredient and a diamine ingredient were dissolved in N-methyl-2-pyrrolidone in such amounts that the total concentration of the acid dianhydride ingredient and the diamine ingredient became 25% by weight. These ingredients were reacted at room temperature for 24 hours to obtain a solution of a polyamic acid.

A photosensitizer was then incorporated according to each of the formulations shown in Tables 1 to 3 and dissolved evenly to obtain a solution of a photosensitive polyimide resin precursor.

Subsequently, the solution of a photosensitive polyimide resin precursor was applied on a copper foil with a spin coater and dried at 80° C. for 20 minutes to obtain a coating film having a thickness of 30 μm.

This coating film was exposed to light with an extra-high pressure mercury lamp (light intensity: 150 mJ) through a photomask, heated at 155° C. for 10 minutes, subsequently developed with a solution of tetramethylammonium hydroxide in water/alcohol (1/1 by volume) (concentration: 5 wt %) to dissolve and remove the unexposed areas of the film, and then rinsed with water to obtain a negative pattern consisting of the polyimide resin precursor.

The pattern thus obtained was heated at 250° C. for 30 minutes in a nitrogen atmosphere to thereby imidize the precursor. Thus, a patterned adhesive consisting of a polyimide resin was obtained on the copper foil.

The following adherends (1) to (5) to be press-bonded to the above patterned adhesive formed on a copper foil were prepared.

(1) Semiconductor chip having aluminum deposit: a silicon chip on which aluminum for semiconductor element wiring had been deposited by evaporation.

(2) Semiconductor chip coated with polyimide film: a silicon chip coated with a polyimide film for semiconductor element passivation.

(3) Semiconductor chip having $SiO_2$ surface: a silicon chip on which an $SiO_2$ film had been formed.

(4) Semiconductor chip having SiN surface: a silicon chip on which an SiN film had been formed.

(5) Substrate having projections: a glass-epoxy substrate on which a copper foil pattern, a solder resist, and solder deposit bumps having a diameter of 100 μm and a height of 20 μm had been formed.

Each of the above adherends (1) to (5) was superposed on the patterned polyimide resin adhesive formed on a copper foil, and the resultant assemblage was hot-pressed at 250° C. and 20 kg/cm². Thereafter, the adhesive strength between the copper foil and the adherend was measured through 180-degree peeling. The results obtained are shown in Tables 4 to 6.

After the adhesive strength measurement, the adherend surface peeled from the copper foil was examined with a scanning electron microscope. As a result, the adhesive in each Example was ascertained to have penetrated into the Åm-order rugged surface of each adherend without leaving vacant spaces on the surface. In contrast, in Comparative Example 1, vacant spaces had been present on part of the interface between the adhesive and each adherend or interfacial failure had occurred.

Furthermore, the adhesives after hot pressing were examined for the retention of pattern shape. As a result, the adhesives in Examples 1 to 9 and Comparative Example 1 each retained the pattern shape which had been possessed prior to the hot pressing. In contrast, in Comparative Example 2, the adhesive had partly flowed out and the pattern shape had been destroyed. (In Tables 4 to 6, the adhesives which retained the pattern shape after hot pressing are indicated by "A", while those which did not retain the pattern shape are indicated by "B".) The $T_g$ and melt viscosity at 250° C. of the above adhesives are shown in Tables 4 to 6.

TABLE 1

| (unit: mol) | Example | | | | | |
|---|---|---|---|---|---|---|
| | 1 | 2 | 3 | 4 | 5 | 6 |
| Acid dianhydride A | 1 | — | 0.5 | — | 1 | — |
| Acid dianhydride B | — | 1 | — | 0.5 | — | 1 |
| Acid dianhydride C | — | — | 0.5 | — | — | — |
| Acid dianhydride D | — | — | — | 0.5 | — | — |
| Acid dianhydride E | — | — | — | — | — | — |
| Diamine A | 0.5 | 0.5 | 0.5 | 0.5 | 0.5 | — |
| Diamine B | 0.5 | 0.5 | 0.5 | 0.5 | 0.5 | 0.8 |
| Diamine C | — | — | — | — | — | 0.2 |
| Diamine D | — | — | — | — | — | — |
| Photosensitizer A | 0.29 | 0.27 | 0.26 | 0.26 | — | — |
| Photosensitizer B | — | — | — | — | 0.29 | 0.29 |

TABLE 2

| (unit: mol) | Example | | |
|---|---|---|---|
| | 7 | 8 | 9 |
| Acid dianhydride A | — | — | — |
| Acid dianhydride B | — | — | — |
| Acid dianhydride C | 1 | 1 | 0 |
| Acid dianhydride D | — | — | 1 |
| Acid dianhydride E | — | — | — |
| Diamine A | — | — | — |
| Diamine B | 0.2 | 0.1 | 0.3 |
| Diamine C | — | — | — |
| Diamine D | 0.8 | 0.9 | 0.7 |
| Photosensitizer A | 0.26 | 0.26 | 0.27 |
| Photosensitizer B | — | — | — |

TABLE 3

| (unit: mol) | Comparative Example | |
|---|---|---|
| | 1 | 2 |
| Acid dianhydride A | — | — |
| Acid dianhydride B | — | 1 |
| Acid dianhydride C | — | — |
| Acid dianhydride D | — | — |
| Acid dianhydride E | 1 | — |
| Diamine A | 1 | — |
| Diamine B | — | 1 |
| Diamine C | — | — |
| Diamine D | — | — |
| Photosensitizer A | 0.18 | 0.30 |
| Photosensitizer B | — | — |

TABLE 4

| | Example | | | | | |
|---|---|---|---|---|---|---|
| | 1 | 2 | 3 | 4 | 5 | 6 |
| Melt viscosity (x10⁴ Pa · s) | 10 | 2 | 30 | 10 | 2 | 0.5 |
| $T_g$ (°C.) | 170 | 120 | 150 | 130 | 170 | 80 |
| Adhesive strength (kg/cm) | | | | | | |
| Adherend (1) | 1.0 | 1.1 | 1.1 | 1.3 | 1.0 | 1.0 |
| Adherend (2) | 1.0 | 1.2 | 1.0 | 1.3 | 0.9 | 1.0 |
| Adherend (3) | 1.2 | 1.2 | 1.2 | 1.4 | 1.1 | 1.1 |
| Adherend (4) | 1.1 | 1.2 | 1.1 | 1.3 | 1.0 | 1.2 |
| Adherend (5) | 1.3 | 1.3 | 1.2 | 1.3 | 1.1 | 1.1 |
| Pattern shape after hot pressing | A | A | A | A | A | A |

TABLE 5

| | Example | | |
|---|---|---|---|
| | 7 | 8 | 9 |
| Melt viscosity (x10⁴ Pa · s) | 0.25 | 0.43 | 0.71 |
| $T_g$ (°C.) | 168 | 184 | 202 |
| Adhesive strength (kg/cm) | | | |
| Adherend (1) | 1.1 | 0.9 | 1.3 |
| Adherend (2) | 1.2 | 1.2 | 1.5 |
| Adherend (3) | 1.3 | 1.3 | 1.7 |
| Adherend (4) | 1.4 | 1.3 | 1.8 |
| Adherend (5) | 0.7 | 0.7 | 1.1 |
| Pattern shape after hot pressing | A | A | A |

TABLE 6

| | Comparative Example | |
|---|---|---|
| | 1 | 2 |
| Melt viscosity (x10⁴ Pa · s) | 500 | 0.03 |
| $T_g$ (°C.) | 260 | 50 |
| Adhesive Strength (kg/cm) | | |
| Adherend (1) | <0.1 | 0.9 |
| Adherend (2) | <0.1 | 0.9 |
| Adherend (3) | <0.1 | 1.1 |
| Adherend (4) | <0.1 | 1.2 |

TABLE 6-continued

|  | Comparative Example | |
| --- | --- | --- |
|  | 1 | 2 |
| Adherend (5) | <0.1 | 1.3 |
| Pattern shape after hot pressing | A | B |

The photosensitive resin composition of the present invention, when exposed to light through a photomask and then developed, gives a patterned film which melts upon heating and preferably has a melt viscosity at 250° C. of from 1,000 to 1,000,000 Pa·s. Consequently, the adhesive in the form of a patterned film thus obtained from the composition can be applied to electronic parts of various shapes having a rugged surface. Namely, the adhesive melts during hot pressing and conforms to or penetrates into the rugged surface of an adherend, whereby a high adhesive strength can be exhibited.

While the invention has been described in detail and with reference to specific embodiments thereof, it will be apparent to one skilled in the art that various changes and modifications can be made therein without departing from the spirit and scope thereof.

What is claimed is:

1. A photosensitive polyimide resin precursor capable of forming a patterned film by being exposed to light through a photomask and then developed, wherein said patterned film melts upon heating.

2. The photosensitive polyimide resin precursor of claim 1, wherein the patterned film has a melt viscosity at 250° C. of from 1,000 to 1,000,000 Pa·s.

3. The photosensitive polyimide resin precursor of claim 1, wherein the patterned film has a glass transition temperature of from 50 to 250° C.

4. The photosensitive polyimide resin precursor of claim 1, which contains a 1,4-dihydropyridine derivative represented by the following general formula (1):

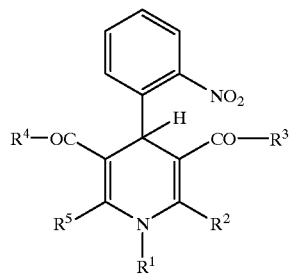

(1)

wherein $R^1$ to $R^5$ each independently is a hydrogen atom or an organic group having 1 to 4 carbon atoms.

5. The photosensitive polyimide resin precursor of claim 1, which comprises a polyamic acid obtained by reacting an acid dianhydride ingredient comprising 2,2-bis(3,4-dicarboxyphenyl) hexafluoropropane dianhydride, represented by the following formula (2), with a diamine ingredient:

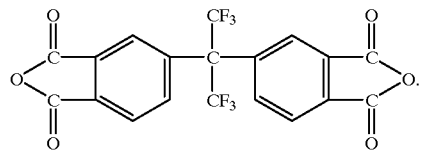

(2)

6. The photosensitive polyimide resin precursor of claim 1, which comprises a polyamic acid obtained by reacting an acid dianhydride ingredient with a diamine ingredient comprising a diamine represented by the following general formula (3):

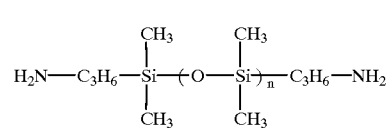

(3)

wherein n is an integer of from 1 to 10.

7. The photosensitive polyimide resin precursor of claim 1, which comprises a polyamic acid obtained by reacting an acid dianhydride ingredient with a diamine ingredient comprising 1,3-bis(3-aminophenoxy)benzene, represented by the following formula (4):

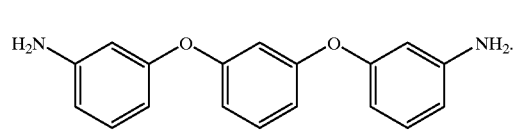

(4)

8. An adhesive in the form of a patterned film which is obtained by a process comprising the steps of: forming a coating film of a photosensitive polyimide resin precursor on a surface of an adherend, exposing the coating film to light through a photomask, and then developing the coating film, wherein the photosensitive polyimide resin precursor is capable of forming a patterned film by exposure to light through a photomask followed by development, and wherein the patterned film melts upon heating.

9. The adhesive of claim 8, wherein the patterned film has a melt viscosity at 250° C. of from 1,000 to 1,000,000 Pa·s.

10. The adhesive of claim 8, wherein the patterned film has a glass transition temperature of from 50 to 250° C.

11. The adhesive of claim 8, wherein the photosensitive polyimide resin precursor comprises a 1,4-dihydropyridine derivative represented by the following general formula (1):

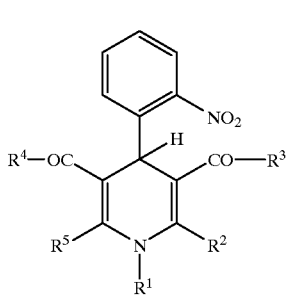

(1)

wherein $R^1$ to $R^5$ each independently is a hydrogen atom or an organic group having 1 to 4 carbon atoms.

12. The adhesive of claim 8, wherein the photosensitive polyimide resin precursor comprises from a polyamic acid obtained by reacting an acid dianhydride ingredient comprising 2,2-bis(3,4-dicarboxyphenyl)hexafluoropropane dianhydride, represented by the following formula (2):

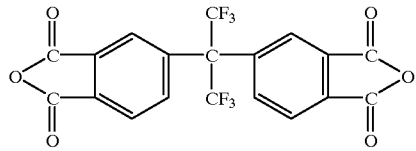
(2)

with a diamine ingredient.

13. The adhesive of claim 8, wherein the photosensitive polyimide resin precursor comprises a polyamic acid obtained by reacting an acid dianhydride ingredient with a diamine ingredient comprising a diamine represented by the following general formula (3):

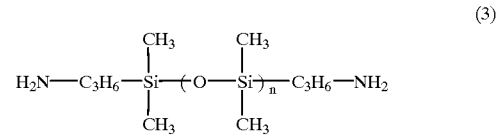
(3)

wherein n is an integer of from 1 to 10.

14. The adhesive of claim 8, wherein the photosensitive polyimide resin precursor comprises a polyamic acid obtained by reacting an acid dianhydride ingredient with a diamine ingredient comprising 1,3bis(3-aminophenoxy)benzene, represented by the following formula (4):

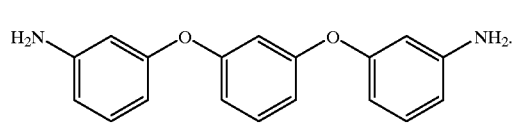
(4)

* * * * *